(12) United States Patent
Ng et al.

(10) Patent No.: US 7,247,931 B2
(45) Date of Patent: Jul. 24, 2007

(54) SEMICONDUCTOR PACKAGE AND LEADFRAME THEREFOR HAVING ANGLED CORNERS

(75) Inventors: Chuan Kiak Ng, Negeri Sembilan (MY); Ein Sun Ng, Negeri Sembilan (MY); Yeu Wen Lee, Seremban (MY)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/491,664

(22) Filed: Jul. 24, 2006

(65) Prior Publication Data

US 2006/0263940 A1 Nov. 23, 2006

Related U.S. Application Data

(62) Division of application No. 10/850,592, filed on May 21, 2004, now Pat. No. 7,105,378.

(30) Foreign Application Priority Data

Feb. 13, 2004 (MY) .............................. PI20040463

(51) Int. Cl.
*H01L 23/495* (2006.01)
*H05K 7/10* (2006.01)

(52) U.S. Cl. ...................... 257/676; 257/773; 257/775; 257/784; 361/808; 361/813

(58) Field of Classification Search ............... None
See application file for complete search history.

(56) References Cited

U.S. PATENT DOCUMENTS

| 5,233,222 A * | 8/1993 | Djennas et al. ............. 257/676 |
| 6,841,854 B2 * | 1/2005 | Itou et al. .................... 257/666 |
| 6,924,548 B2 * | 8/2005 | Hasebe et al. ............... 257/674 |
| 7,105,378 B2 * | 9/2006 | Ng et al. ..................... 438/111 |

FOREIGN PATENT DOCUMENTS

JP 11074440 A * 3/1999

* cited by examiner

*Primary Examiner*—Alonzo Chambliss
(74) *Attorney, Agent, or Firm*—Robert F. Hightower

(57) ABSTRACT

A leadframe for a semiconductor package is formed with an indentation on a bottom surface. A side of the indentation is used to form a mold-lock that assists in securing the leadframe to the encapsulation material of the semiconductor package.

7 Claims, 6 Drawing Sheets

SEMICONDUCTOR PACKAGE AND LEADFRAME THEREFOR HAVING ANGLED CORNERS

This application is a division of U.S. application Ser. No. 10/850,592, filed May 21, 2004, now U.S. Pat. No. 7,105,378.

BACKGROUND OF THE INVENTION

The present invention relates, in general, to electronics, and more particularly, to methods of forming semiconductor packages and leadframes.

In the past, the electronics industry utilized various methods and structures to form leadframes for semiconductor packages. Of particular interest was leadframes for QFN packages. QFN packages typically were very small and had a connection pad on a bottom surface of the semiconductor package. In some cases, a right angle mold-lock feature was formed at a corner or edge of the connection pad in order to assist in creating a firm attachment to the encapsulating compound that was used to form the package. One problem with these leadframes and packages was cost. Typically, etching techniques had to be used to form the leadframes because the right angle mold-lock feature could not reliably be formed with the prior stamping techniques. The etching techniques were expensive and slow and resulted in high manufacturing costs.

Accordingly, it is desirable to have a leadframe that has a reliable mold-lock, that is formed by a non-etching techniques, and that has a low cost.

BRIEF DESCRIPTION OF THE DRAWINGS

For simplicity and clarity of illustration, elements in the figures are not necessarily to scale, and the same reference numbers in different figures denote the same elements. Additionally, descriptions and details of well known steps and elements are omitted for simplicity of the description.

DETAILED DESCRIPTION OF THE DRAWINGS

Figure 1:
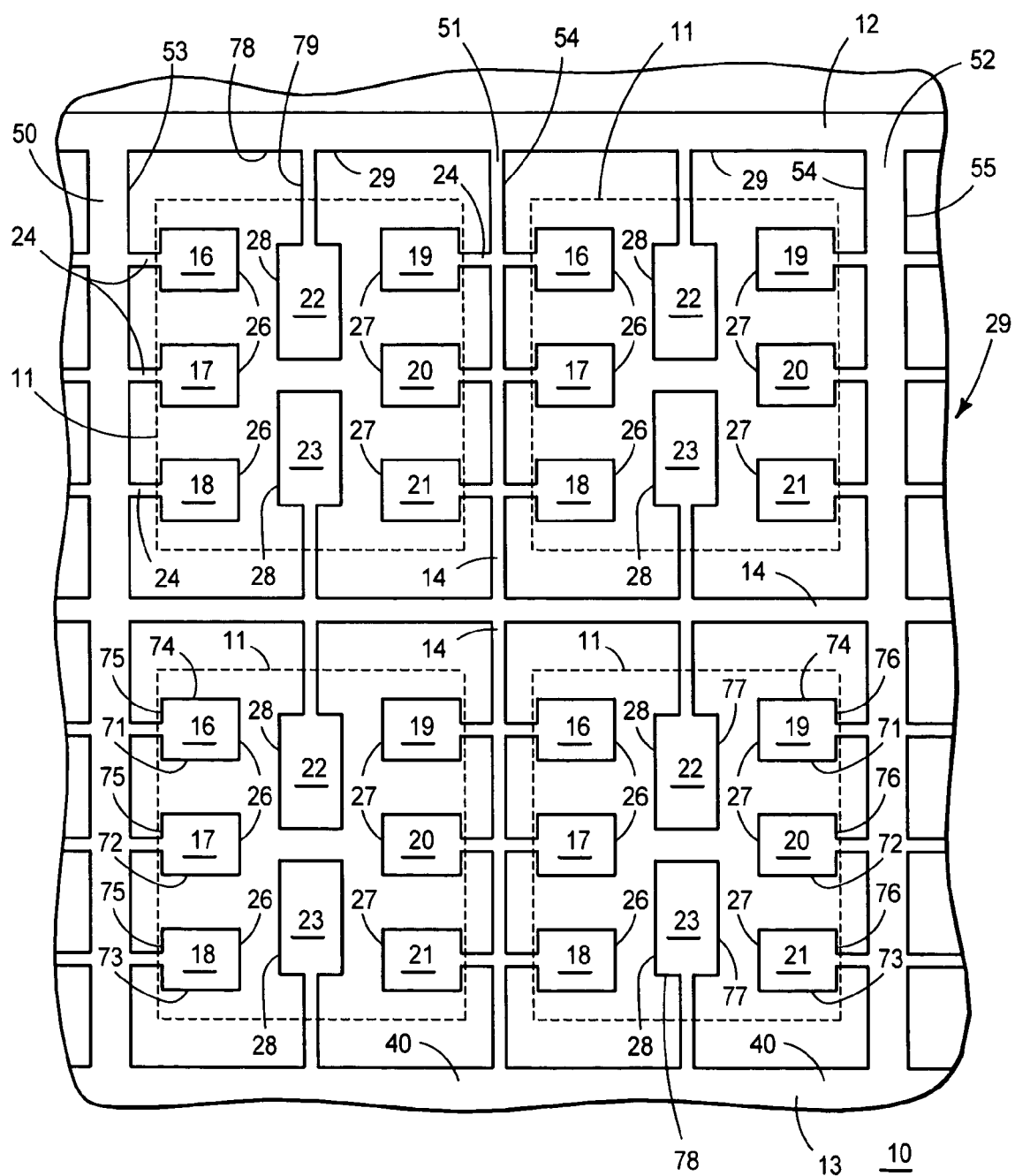
FIG. 1 schematically illustrates an enlarged plan view of a portion of an embodiment of a leadframe in accordance with the present invention.

FIG. 1 schematically illustrates an enlarged top plan view of a portion of a leadframe 10 that is subsequently used in the manufacturing of a semiconductor package. Leadframe 10 typically includes a leadframe panel 29 having a plurality of package sites 11 where semiconductor packages will subsequently be formed. Package sites 11 are identified in general by a dashed box. Each site 11 typically includes a plurality of contact pads that includes contact pads 16, 17, 18, 19, 20, and 21 that are within package site 11. Pads 16, 17, 18, 19, 20, and 21 may be referred to hereinafter as plurality of pads 16-21 or pads 16-21. Each site 11 also typically includes die attachment areas or flags 22 and 23. Although two flags 22 and 23 are illustrated, some embodiments may only have one flag or may have more than two flags. Pads 16-21 and flags 22-23 are secured by a plurality of tie strips 24 that typically are connected to a plurality of support rails that surround each site 11. The plurality of support rails include a top rail 12 and a bottom rail 13 that typically run horizontally across leadframe 10, in addition to vertical support rails 50, 51, and 52, and a plurality of smaller support rails 14 that run in between the other rails and around sites 11. Rails 12-14 and 50-52 in addition to strips 24 support pads 16-21 and flags 22-23 during manufacturing operations. Such tie strips and support rails are well-known to those skilled in the art.

Pads 16-18 have an inside edge or vertical side 26, pads 19-21 have an inside edge or vertical side 27, and flags 22 and 23 have an inside edge or vertical side 28. Pads 16-21 also have other sides including sides 71-76 and flags 22-23 have other sides including sides 77-78. As will be seen hereinafter, all of the sides of pads 16-21 and flags 22-23 including sides 26-28 and 71-78 typically are formed with a mold-lock that assists in forming a secure attachment between an encapsulation material and pads 16-21 and flags 22-23. However, in some embodiments some of sides 26-28 and 71-78 may omit the mold-lock.

Figure 2:
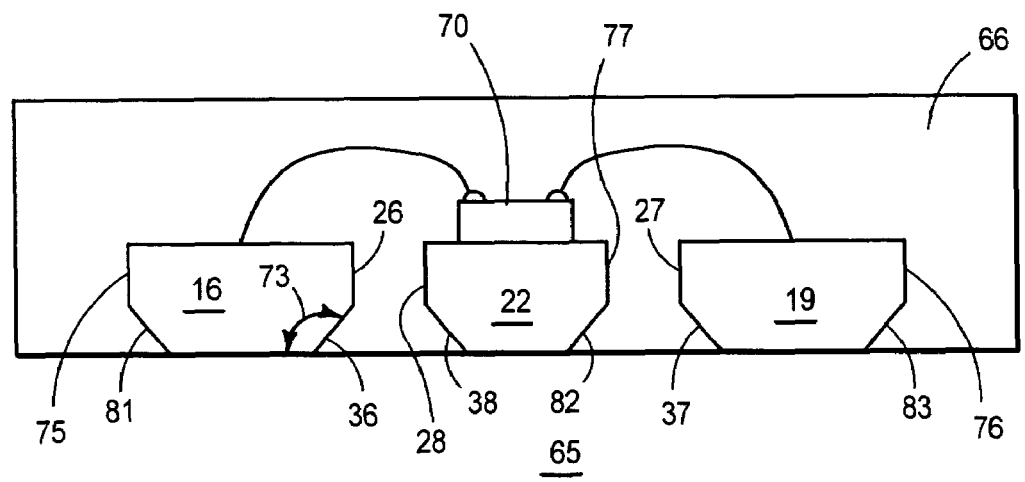
FIG. 2 schematically illustrates an enlarged cross-sectional view of an embodiment of a semiconductor package that utilizes the leadframe of FIG. 1 in accordance with the present invention.

FIG. 2 schematically illustrates an enlarged cross-sectional portion of an embodiment of a semiconductor package 65 that utilizes a package site 11 of leadframe 10 in the formation of package 65. In forming package 65, leadframe 10 is placed into a mold press that has molding cavities which are substantially the same shape as sites 11. After encapsulation, the packages are singulated from leadframe 10 to form individual packages such as package 65. Package 65 includes plurality of connection pads 16-21 and flags 22 and 23. The cross-sectional view of FIG. 2 is taken through flag 22 and pads 16 and 19. Flag 22 has a top surface where a semiconductor die 70 is attached. Pads 16 and 19 have a top surface to which bonding wires are attached for connection to die 70. Sides 26 and 75 and sides 27 and 76 of pads 16 and 19, respectively, extend from the top surface toward the respective bottom surface of pads 16 and 19. Similarly, sides 28 and 77 of flags 22 and 23 extend from the top surface toward the respective bottom surface of flags 22 and 23. As will be explained further hereinafter, leadframe 10 is formed with mold-locks 36 and 81 positioned at the corners connecting respective sides 26 and 75 to the bottom surface of pad 16. Similarly mold-locks 37 and 83 and mold-locks 38 and 82 are formed to connect respective sides 27 and 76 of pad 19 and sides 28 and 77 of flag 22 to the respective bottom surfaces of pad 19 and flag 22. In the preferred embodiment, the mold locks are formed with a wedge or inverted V-shape relative to the bottom surfaces so that the resulting mold-lock forms a corner having an internal angle 73 with the respective bottom surface. Angle 73 is described in more detail in the description of FIG. 9.

Figure 3:
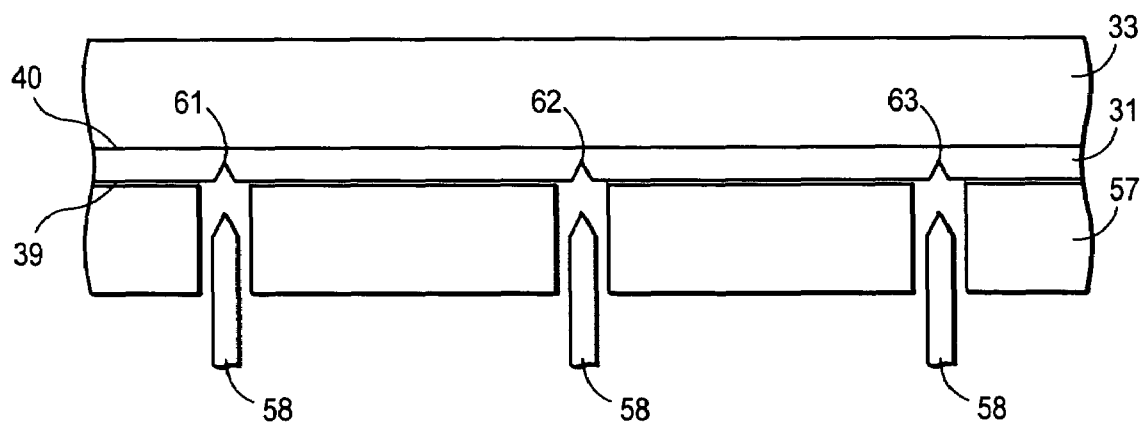
FIG. 3 schematically illustrates an enlarged cross-sectional view of a portion of an embodiment of the leadframe of FIG. 1 at a stage of manufacturing in accordance with the present invention.

FIG. 3 schematically illustrates an enlarged cross-sectional view of a portion of an embodiment of leadframe 10 at a stage of manufacturing. This description has references to FIG. 1, FIG. 2, and FIG. 3. Leadframe 10, thus panel 29, typically is formed from a blank panel 31 that has a sufficient length and width to form a desired number of package sites 11. In some embodiments, panel 31 may have some features formed in the panel prior to the hereinafter described steps, thus, panel 31 may not be completely blank. Panel 31 typically is a long thin sheet of copper, alloy 42, or other similar metal. In order to form blank panel 31 into panel 29 and leadframe 10, portions of panel 31 are removed in order to leave pads 16-21, flags 22-23, rails 12-14, strips 24, and rails 50-52. During the process of removing these portions of panel 31, mold-locks such as mold-locks 36-38 are also formed in leadframe 10. Typically, indentations are first formed in a bottom surface 39 of panel 31, thus, bottom surface 39 of leadframe 10. The indentations are formed where the mold-locks are desired. Because the tools that are used to form the indentations typically are larger than the spacing between pads 16-21 and flags 22-23, several indentation operations may be required to form all the required indentations. After the indentations are formed, portions of panel 31 overlying the indentations are removed from top surface 40. The removal steps generally are preformed so that the removed portions of panel 31 overlap at least a portion of the underlying indentations. Thus, the removed portion also overlaps at least a portion of the indentations in bottom surface 39. Since the tools that are used to perform the removal operations are also larger than the spacings, the removal steps typically are also performed in stages. Consequently, it can be seen that there may be several different combinations of indentation and removal sequences and that such sequences may be performed in various combinations to form leadframe 10.

For example, in one removal sequence, indentations are first made under the sides of rails 50-52 (see FIG. 1 and FIG. 3), then in sequence under sides 26-28, then sides 75-77, 77, etc. until all of the sides of pads 16-21 and flags 22-23 23 in addition to any other desired portions of leadframe 10 have indentations in bottom surface 39. Then portions of panel 31 are removed along the underlying indentations. For example the portion of panel 31 bounded by sides 26, 28, 53, 78, and 79 (see FIG. 1) in each site 11 may be removed in one step, then another portion of panel 31 is removed in a subsequent step. This example is explained in more detail in the description of FIG. 3-FIG. 9.

Referring still to FIG. 3 and the example removal sequence, to form sides 53, 54, and 55 of rails 50, 51, and 52, respectively, indentations 61, 62, and 63 are formed in bottom surface 39 underlying the position at which respective sides 53, 54, and 55 of rails 50, 51, and 52 will subsequently be formed. In order to form indentations 61-63, panel 31 is placed into an indentation or coining tool. The coining tool typically has a stripper plate 57 through which punch tips 58 can be forced into bottom surface 39. A gripper plate 33 typically presses panel 31 against plate 57 and holds panel 31 in place during the formation of indentations 61-63. Such an operation is often referred to as coining.

Figure 4:
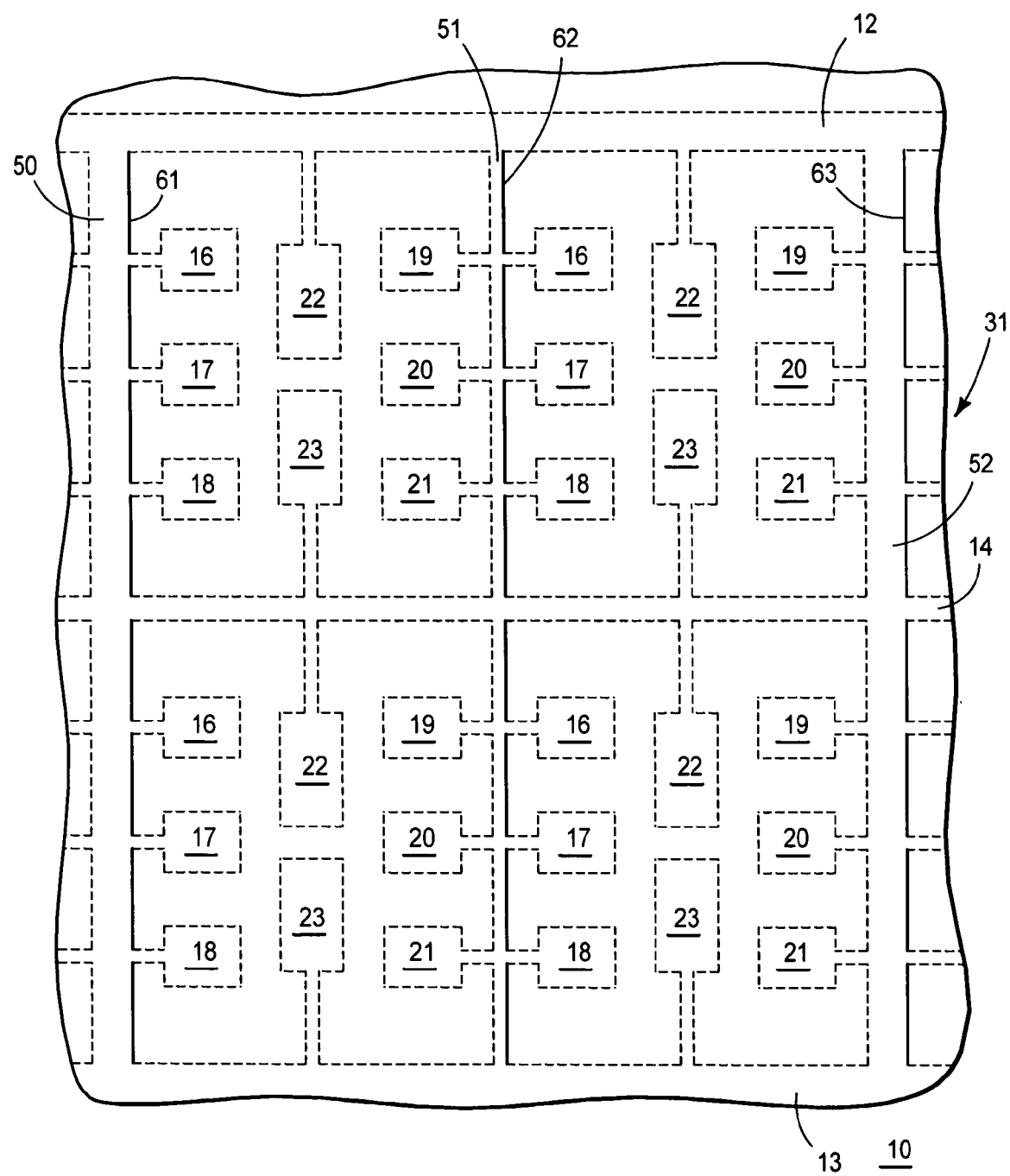
FIG. 4 through FIG. 8 schematically illustrate enlarged views of the leadframe of FIG. 3 at various stages of manufacturing in accordance with the present invention.

FIG. 4 schematically illustrates an enlarged bottom plan view of a portion of an embodiment of leadframe 10 subsequent to forming indentations 61-63. Other portions of leadframe 10 that will subsequently be formed are illustrated by dashed lines to show the relative positioning of indentations 61-63 to pads 16-21 and flags 22-23.

Figure 5:
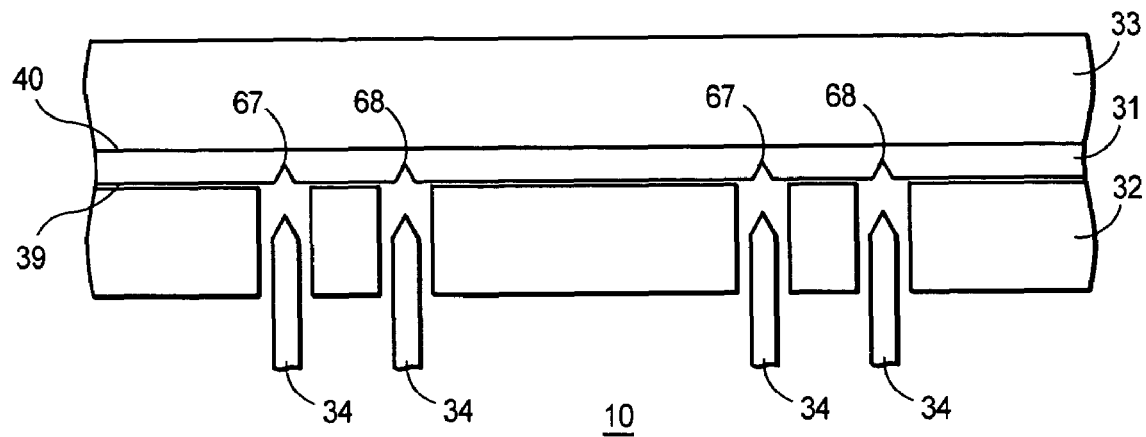

FIG. 5 schematically illustrates an enlarged cross-sectional view of a portion of an embodiment of leadframe 10 at a subsequent stage of manufacturing. After indentations 61-63 are formed, panel 31 is placed into the coining tool with another stripper plate 32 that has punch tips 34 which are positioned underlying locations where sides 26 and 27 are to be formed. Tips 34 are forced into surface 39 to form indentations 67 and 68 underlying the position where sides 26 and 27 are subsequently to be formed.

Figure 6:
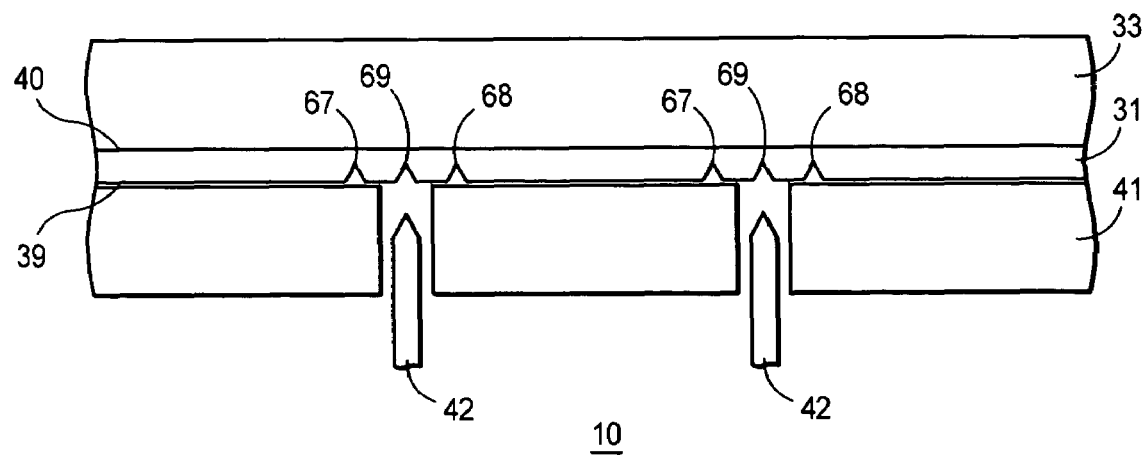

FIG. 6 schematically illustrates a further stage in the manufacturing of leadframe 10. Panel 31 is placed into the coining tool with another stripper plate 41 that has punch tips 42 which are positioned underlying the locations where sides 28 are subsequently to be formed. Tips 42 are forced into surface 39 to form indentations 69 underlying the position where sides 28 are to be located. For this example, it is assumed that sides 28 are too close to sides 26 and 27 for indentations 67-69 to be formed during one step.

Figure 7:
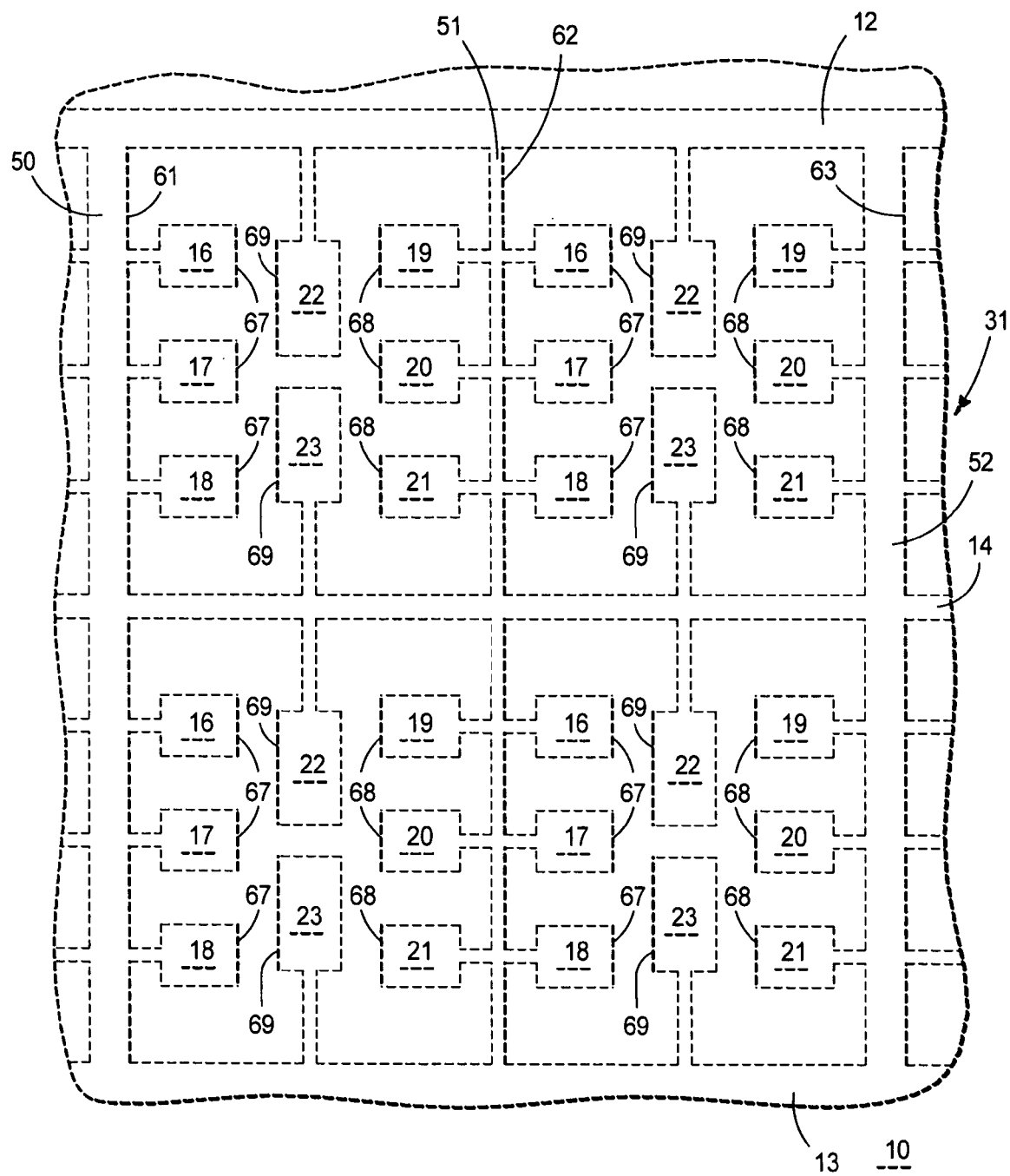

FIG. 7 schematically illustrates an enlarged bottom plan view of a portion of an embodiment of panel 31 subsequent to forming indentations 67-69. Other portions of leadframe 10 that will subsequently be formed are illustrated by dashed lines to show the relative positioning of indentations 67-69 to pads 16-21 and flags 22-23.

Indentations are subsequently made in bottom surface 39 underlying the edges of the other portions of leadframe 10 where mold-locks are desired. Additionally, indentations may be made around the periphery of portions of panel 31 that are to be removed but where mold-lock features are not required, for example underlying rails 12 and 13. The indentations in these areas assist in removing the portions of panel 31 without deforming leadframe 10.

Figure 8:
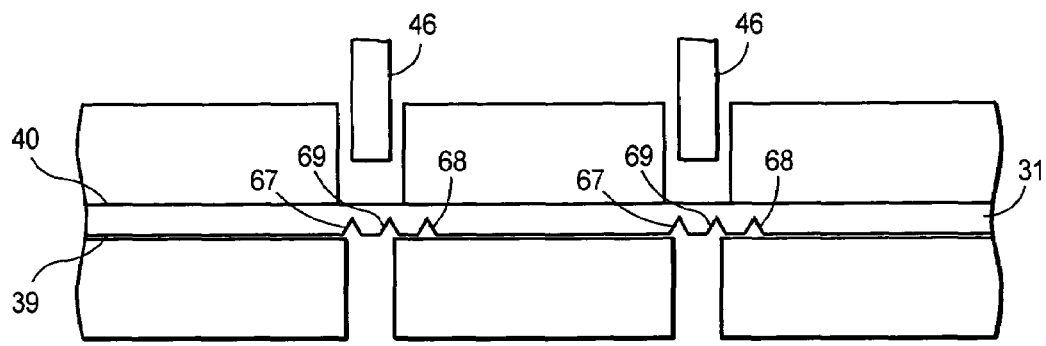

FIG. 8 schematically illustrates a still further stage in the manufacturing of leadframe 10. After indentations are formed underlying all sides of pads 16-21 and flags 22-23 where mold-locks are to be formed in addition to other desired locations, the portions of panel 31 that are not a portion of leadframe 10 are removed from panel 31. As described hereinbefore, in some embodiments indentations may also be formed under the sides of rails 12-13 and 50-52. Panel 31 is placed into a stamping tool or punch tool having punch tips 46 that are positioned over a portion of panel 31 that is to be removed. For example, each tip 46 may be formed with a periphery that matches the periphery of the portion of panel 31 bounded by sides 79, 78, 53, strip 24, sides 75, 74, and 26 of pad 16, and adjacent sides of flag 22, including the portion of side 28 opposite to side 26 (See FIG. 1). Tool tip 46 is positioned so that the outside edges of tip 46 cut through panel 31 and overlap to approximately the middle of the underlying indentations such as indentations 67 and 69. Tip 46 then punches an opening 60 (see FIG. 9) from top surface 40 through panel 31 so that approximately one half of the underlying indentation is removed and one half remains to form the mold-lock.

Figure 9:
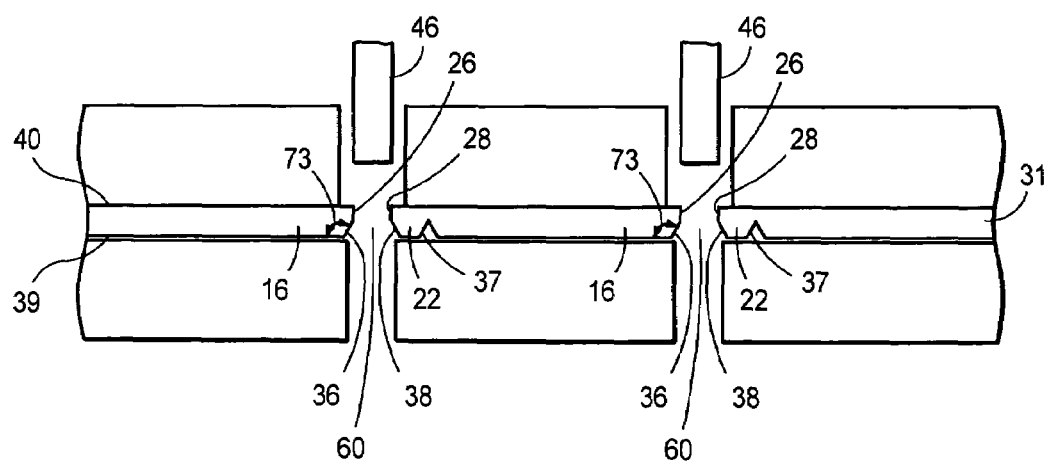
FIG. 9 schematically illustrates an enlarged cross-sectional view of a portion of an embodiment of the leadframe FIG. 8 at a subsequent manufacturing stage in accordance with the present invention.

FIG. 9 schematically illustrates an even further stage in the manufacturing of leadframe 10. Tip 46 forms openings 60 through panel 31. The portions of indentations 67 and 69 that remain at the corners form mold-locks 36 and 38, respectively. Subsequently, other punch tools are used to remove other portions of panel 31 by forming openings through panel 31 from top surface 40 and removing a portion of the underlying indentations.

In the preferred embodiment, the indentations including indentations 61-63 and 67-69 are formed with a wedge or inverted V-shape so that the resulting mold-lock forms a corner having an internal angle 73 relative to bottom surface 39 that is greater than ninety (90) degrees and preferably is about one hundred thirty-five (135) degrees. Forming a corner with an internal angle that is not ninety degrees assists in forming a solid attachment between encapsulation material 66 (FIG. 2) and pads 16-21 and flags 22-23. Additionally, forming the angle at the corner minimizes deformation in bottom surface 39 during the formation of the openings through panel 31. Using an angle corner also ensures that any rough edges of pads 16-21 or flags 22-23 are near the intersection of the corresponding side and the mold-lock, such as near the intersection of side 26 and mold-lock 36. This assists in providing a smooth bottom surface 39 which eases the task of attaching package 65 (Shown in FIG. 2) to circuit boards and other attachment substrates. Typically the indentations including indentations 61-63 and 67-69 extend into panel 31 between about fifty percent (50%) to seventy-five percent (75%) of the thickness of panel 31. Typically, panel 31 has a thickness of about two hundred fifty (250) to one thousand (1000) microns but may be other thicknesses.

Figure 10:
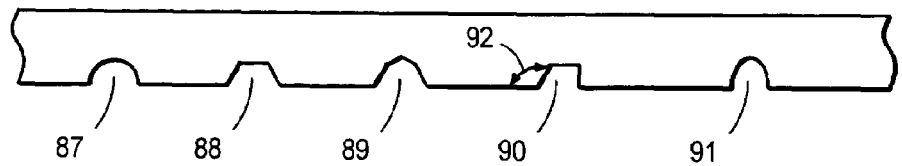
FIG. 10 schematically illustrates an embodiment of some other shapes that may be used for forming indentations in accordance with the present invention.

FIG. 10 schematically illustrates different shapes that may be used for the indentations and the resulting mold-locks. An indentation 87 is formed to have a semi-circular shape, an indentation 88 is formed to have three sides of a pentagon, or an indentation 89 is formed to have four sides of a hexagon. An indentation 90 is formed to have various angles but does have an angle 92 that can be used to form the mold-lock. For indentation 90, the overlying opening is formed to remove the portion to the right of the sloped portion formed by angle 92. An elliptical or oval shaped indentation 91 can also be used to create a non-right angle for the mold-lock. It can be seen, that the amount of overlap between the opening and the indentation is a function of the shape of the indentation and the desired size of the resulting mold-lock. For example, various amounts of overlap may be used for the various shapes of indentations 87-91. The shape of indentation 90 may require that more of the indentation be removed to form the mold-lock than would be removed for indentations 61-63 shown in FIG. 3. For example, more than fifty percent of indentation 90 may have to be removed to form a mold-lock such as mold-lock 36.

In view of all of the above, it is evident that a novel leadframe, method of forming a leadframe, and method of using the leadframe to form a semiconductor package is disclosed. Included, among other features, is forming an indentation in a blank leadframe panel and forming an opening through the panel with the opening overlapping a portion of the indentation. Forming the indentation prior to forming the opening minimizes distortion of the leadframe, improves the planarity of the contact pad thereby making it easier to attach the resulting package, reduces the manufacturing costs, and improves bonding between the leadframe and the encapsulation material.

While the invention is described with specific preferred embodiments, it is evident that many alternatives and variations will be apparent to those skilled in the semiconductor arts. More specifically, the sequence of forming the various indentations and the sequence of forming openings through the indentations may be performed in various sequences in addition to the described sequences.

The invention claimed is:

1. A leadframe for a semiconductor package comprising:
a leadframe panel having a thickness and a plurality of package sites;
a connection pad and the flag within a package site of the plurality of package sites, the connection pad and the flag having a top surface, a bottom surface, and a side extending from the top surface to the bottom surface, the side positioned on an outside perimeter of the connection pad and the flag and having a first portion extending from the top surface and also having a second portion extending away from the first portion to the bottom surface wherein the first portion and the second portion are not parallel; and
a corner formed at an intersection between the second portion of the side and the bottom surface and forming an angle between the bottom surface and the second portion of the side that is greater than ninety degrees.

2. The leadframe of claim 1 wherein the second portion of the side extends up to seventy-five percent of the thickness of the leadframe panel.

3. The leadframe of claim 1 wherein the angle is no greater than one hundred thirty-five degrees.

4. The leadframe of claim 1 wherein the leadframe panel has a thickness between 250 and 1000 microns.

5. The leadframe of claim 1 wherein the second portion of the side has a shape that is approximately one-half of one of a semi-circle, a three-sided shape, or a five-sided shape.

6. A semiconductor package comprising:
a connection pad and the flag having a top surface, a bottom surface, and a side having a first portion extending from the top surface toward the bottom surface and the side also having a second portion extending from the first portion toward the bottom surface wherein the first portion and the second portion are not parallel and wherein the side is on an outside perimeter of the connection pad and the flag;
a package body encapsulating the top surface of the connection pad and the flag and at least a portion of the side of the connection pad and the flag; and
a corner formed at an intersection of the second portion of the side of the connection pad and the flag and the bottom surface and forming an angle between the bottom surface and the second portion that is greater than ninety degrees.

7. The semiconductor package of claim 6 wherein the second portion has a shape that is approximately one-half of one of a semi-circle, a three-sided shape, or a five-sided shape.

* * * * *